US00RE41935E

(19) United States
(12) Reissued Patent
Pan et al.

(10) Patent Number: US RE41,935 E
(45) Date of Reissued Patent: Nov. 16, 2010

(54) METHOD FOR PREVENTING LOW-K DIELECTRIC LAYER CRACKING IN MULTI-LAYERED DUAL DAMASCENE METALLIZATION LAYERS

(75) Inventors: Shing-Chyang Pan, Hsin-Chu (TW); Keng-Chu Lin, Ping-Tung County (TW); Wen-Chih Chiou, Maoli County (TW); Shwang-Ming Jeng, Hsin-Chu (TW)

(73) Assignee: Taiwan Semiconductor Manufacturing Company, Ltd., Hsin-Chu (TW)

(21) Appl. No.: 11/655,743

(22) Filed: Jan. 19, 2007

Related U.S. Patent Documents

Reissue of:

(64) Patent No.: 6,846,756
Issued: Jan. 25, 2005
Appl. No.: 10/208,327
Filed: Jul. 30, 2002

(51) Int. Cl.

| | |
|---|---|
| ***H01L 21/26*** | (2006.01) |
| ***H01L 21/324*** | (2006.01) |
| ***H01L 21/42*** | (2006.01) |
| ***H01L 21/4763*** | (2006.01) |
| ***H01L 21/477*** | (2006.01) |

(52) U.S. Cl. ..... 438/638; 438/639; 438/798; 257/E21.579

(58) Field of Classification Search ..... 438/676, 438/618, 637, 669, 701, 708, 756, 758, 780, 438/782, 798

See application file for complete search history.

(56) References Cited

U.S. PATENT DOCUMENTS 6,472,333 B2 * 10/2002 Xia et al. ..... 438/780
6,503,829 B2 * 1/2003 Kim et al. ..... 438/637

FOREIGN PATENT DOCUMENTS

WO WO 2001045154 * 12/2000
WO WO 2002016477 * 8/2001
WO WO 2003005429 * 11/2003

OTHER PUBLICATIONS

Fayolle, M. et al., "Integration of Cu/SioC in CU Dual Damascene Interconnect For 1–mum Technology", Journal, vol. 64 (1–4), pp. 35–42 2002.*

* cited by examiner

*Primary Examiner*—Stephen W Smoot
(74) *Attorney, Agent, or Firm*—Slater & Matsil, L.L.P.

(57) ABSTRACT

A method for plasma treatment of anisotropically etched openings to improve a crack initiation and propagation resistance including providing a semiconductor wafer having a process surface including anisotropically etched openings extending at least partially through a dielectric insulating layer; plasma treating in at least one plasma treatment the process surface including the anisotropically etched openings to improve an adhesion of a subsequently deposited refractory metal adhesion/barrier layer thereover; and, blanket depositing at least one refractory metal adhesion/barrier layer to line the anisotropically etched openings.

43 Claims, 2 Drawing Sheets

METHOD FOR PREVENTING LOW-K DIELECTRIC LAYER CRACKING IN MULTI-LAYERED DUAL DAMASCENE METALLIZATION LAYERS

Matter enclosed in heavy brackets [ ] appears in the original patent but forms no part of this reissue specification; matter printed in italics indicates the additions made by reissue.

FIELD OF THE INVENTION

This invention generally relates to multi-layered semiconductor structures and more particularly to a method for preventing cracking in multi-layered dual damascenes.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low RC (resistance capacitance) metal interconnect properties, particularly wherein submicron via/contact holes (inter-layer interconnects) and intra-layer interconnects with increasingly high aspect ratios.

In the fabrication of semiconductor devices, increased device density requires multiple layers, making necessary the provision of a multi-layered interconnect structure. Such a multi-layered interconnect structure typically includes intra-layer conductive interconnects (wiring) and inter-layer conductive interconnects formed by openings or holes in an insulating layer (inter-metal dielectric layer). Such holes are commonly referred to as vias, for example, when the hole extends through an insulating layer between two conductive layers. The intra-layer interconnects, for example, trench lines are formed in dielectric insulating layers and backfilled with metal and frequently referred to as metallization layers. In one manufacturing approach, trench lines are formed overlying and encompassing vias to form dual damascene interconnect structures.

In a typical process for forming multiple layer interconnect structure, for example, a dual damascene process, an insulating inter-metal dielectric (IMD) layer is deposited over a conductive area, for example a metallization layer frequently referred to as M1, M2, M3, etc. depending on the number of preceding metallization layers. In one approach to forming a dual damascene structure a high aspect ratio opening referred to as a via is then anisotropically etched through the IMD layer by conventional photolithographic and etching techniques. Another anisotropically etched opening referred to as a trench line is then formed according to a second photolithographic patterning process overlying and encompassing the via opening. The via opening and the trench line together makeup the dual damascene structure which is subsequently filled with metal, for example, copper, followed by a (chemical mechanical polishing (CMP) process to planarize the wafer process surface and prepare the process surface for formation of another layer or level in a multi-layered semiconductor device.

Signal transport speed is of great concern in the semiconductor processing art for obvious performance reasons. The signal transport speed of semiconductor circuitry, also referred to as the RC time constant, varies inversely with the resistance and capacitance (RC) of the interconnections. As integrated circuits become more complex and feature sizes decrease, the effect of the RC time constant on signal delay becomes greater.

Copper (Cu) and copper alloys are increasingly being used for the conductive metal filling in damascene and dual damascene structures. Copper has a lower resistivity and consequently produces less current heating and signal delay associated with the RC time constant in increasingly faster circuits. The use of copper for device interconnects has created a number of new technological problems in semiconductor device manufacturing that must be overcome to provide reliable devices. One problem with copper interconnects has been the fact that copper readily diffuses through silicon dioxide or silicon dioxide based materials, a typical IMD material. The diffusion of copper into the IMD layer reduces both the effectiveness of the electrical interconnect and the electrical insulation properties of the IMD layers. Another problem is that copper has poor adhesion to silicon dioxide based IMD layers. The technological difficulties associated with the use of copper have additionally manifested themselves in parallel efforts to reduce the capacitance contribution of the IMD layers to the RC time constant, such reduction being necessary to achieve increased signal transport speeds. For example, by lowering both the dielectric constant of the insulating material used to form the IMD layer and reducing the thickness, the capacitance contribution of the IMD layer is reduced thereby allowing faster signal transport. One difficulty is that the reduced strength of low-k materials in combination with thinner layers frequently results in cracking when such materials are subjected to thermal stresses.

Typical low-k (low dielectric constant) materials in use have included carbon doped silicon dioxide such as commercially available BLACK DIAMOND™ and other materials tend to form a porous material thereby reducing the overall dielectric constant. Porous low-k materials have a drawback in that the porosity tends to weaken the overall strength and hardness of the material making crack initiation and propagation more likely. As the requirement for device density increases, the number of levels in a device has increased to 4 to 7 levels. The increased number of material layers contributes the buildup of compressive and tensile stresses in the multiple layers, especially when subjected to thermal stresses, which frequently do not offset one another. The result is that cracking becomes more likely as the number of device layers increase and the process wafer is subjected to externally induced cycling stresses including thermal heating and cooling.

For example, in the use of copper or copper alloys for forming conductive interconnects, it has been found to that electroplating of copper has many advantages over other methods such as PVD or CVD methods of deposition, such as superior step coverage for high aspect ratio openings. Following electrodeposition, a CMP process is carried out to remove excess deposited copper and to planarize the process surface for subsequent layer formation. Frequently, the copper filling is subjected to a thermal annealing treatment approaching 400° C. to improve the metallurgical qualities of the copper. In addition, the deposition of an overlying etching stop layer such as silicon nitride, silicon oxynitride or silicon carbide by plasma enhanced CVD techniques typically requires a wafer substrate heated to about 400° C. Other processing steps including plasma pre-cleaning processes prior to a material layer deposition may also include temperatures subjecting the wafer to thermal stresses.

One particular serious problem that requires a solution is the tendency for copper filled damascene structures that are in upper levels, for example, above about metallization layer 3 to exhibit crack initiation and propagation through low-k IMD layers as a result of thermal cycling stresses. The problem of cracking is exacerbated in a multiple layer structure where multiple stresses in the various layers may combine to achieve stresses necessary for crack initiation and propagation. The propagation of cracks through the IMD layer is catastrophic to device functioning and frequently requires the scraping of a process wafer.

It is therefore an object of the invention to develop a method for semiconductor manufacturing of damascene structures that will prevent crack initiation and propagation in low-k IMD layers while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for plasma treatment of anisotropically etched openings to improve a crack initiation and propagation resistance.

In a first embodiment, the method includes providing a semiconductor wafer having a process surface including anisotropically etched openings extending at least partially through a dielectric insulating layer; plasma treating in at least one plasma treatment the process surface including the anisotropically etched openings to improve an adhesion of a subsequently deposited refractory metal adhesion/barrier layer thereover; and, blanket depositing at least one refractory metal adhesion/barrier layer to line the anisotropically etched openings.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Figure 1A:
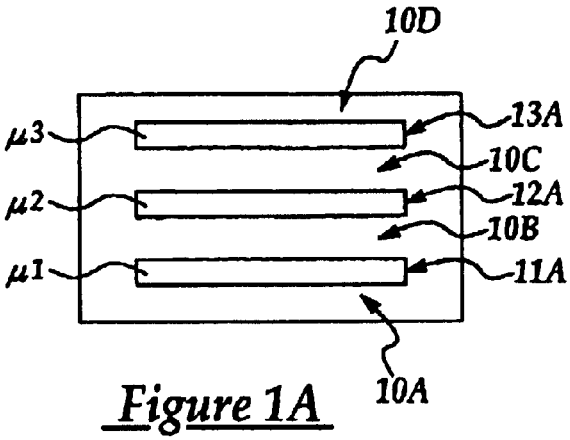
FIGS. 1A–1B are cross sectional side views of a portion of a multiple layer semiconductor device having substantially aligned metallization layer metal filled trench edge portions according to one embodiment of the present invention.

Although the method of the present invention is explained by exemplary reference the formation of a dual damascene structure according to a via-first method of formation in a multi-level semiconductor device it will be appreciated that the method of the present invention is equally applicable to other methods of dual or single damascene structure formation including other metal filled anisotropically etched openings. While the method of the present invention is particularly advantageously implemented with respect to copper filled dual damascene structures, it will be appreciated that the method may be adapted for use with other metals, for example tungsten, aluminum, and copper or alloys thereof in a multi-layered semiconductor device to improve an adhesion/barrier layer adhesion strength thereby preventing stress induced crack initiation and propagation through a dielectric insulating layer. For example, although the method of the present invention is particularly advantageously implemented with the formation of a tantalum nitride adhesion/barrier layer, it will be appreciated that the method of the present invention may be adapted for use with other refractory metal adhesion/barrier layers or multi-layers, including for example tungsten nitride, titanium nitride, titanium/titanium nitride, tantalum/tantalum nitride, and silicided titanium nitride.

It has been found that in multi-layer devices extending above about a M2 or M3 layer, for example the multi-layer device having a thickness of greater than about 2 microns, that the probability of crack initiation and propagation is increased within low-k IMD layers, the cracks frequently originating along the sidewalls of trench lines, for example, as a portion of a dual damascene structure. It has been found that crack initiation occurs at the interface of an adhesion/barrier layer lining the dual damascene structure and the IMD layer. It is believed that factors contributing to cracking include poor adhesion between the metal filled dual damascene structure and the adhesion/barrier layer; a relatively higher coefficient of thermal expansion (CTE) of the copper compared to the IMD layer; and tensile stresses exhibited by the IMD layer on the trench sidewalls, for example during the cooling cycle of thermal cycling. It has been found that the likelihood of cracking is increased where stacked metallization layer edge portions, for example trench line edge portions, are aligned with underlying metallization layers including metal filled trench line edge portions. It is believed that the alignment of the metallization layer edge portions contributes to a summation of individual CTE induced stresses in the various layers ultimately causing the fracture strength of the IMD layer to be exceeded to thereby initiate cracking and propagation thereof. The cracking problem has been found to be particularly acute where about 3 metallization layers have been formed including where a relatively thinner upper level IMD layer overlies a relatively wider metallization layer.

Figure 1B:
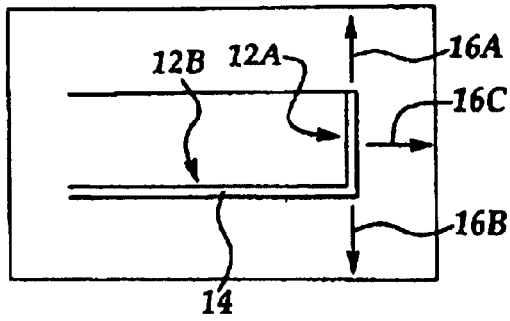

For example, referring to FIG. 1A is shown a schematic representation of a cross sectional portion of a multiple layer semiconductor device showing metallization layers (trench lines) M1, M2, M3 having intervening IMD areas, e.g., 10A, 10B, 10C, and 10D. For example, the IMD areas (layers) are formed of a low-k (low dielectric constant) carbon doped silicon oxide, for example BLACK DIAMOND™ having a dielectric constant of less than about 3.2. It is seen that the trench line sidewall edge portions, e.g., 12A of metallization layer M2, are aligned with overlying M3 sidewall edge portion 13A and underlying M1 sidewall edge portion 11A. Referring to FIG. 1B, is shown an expanded view portion of a metallization layer edge portion, e.g., trench line M2 including a refractory metal adhesion/barrier layer 14, for example tantalum nitride (e.g., TaN), lining the sidewall edge portion, e.g., 12A and the bottom portion 12B of M2, for example, a copper filled trench line. Shown also are tensile stress directional arrows 16A, 16B, and 16C at the sidewall portion 12A including adhesion/barrier layer 14. It has been found that subjecting the multiple layer device, for example including M1, M2, and M3 layers to thermal cycling stresses, for example, during thermal cycling processing steps prior to forming overlying metallization layer M4 (not shown), that the summation of stresses in the multiple metallization layers including, for example, stacked dual damascene structures, is sufficient to initiate cracking at the edge portions of metallization layers, for example sidewall edge portions of trench lines, the crack propagating substantially along a direction indicated by stress direction arrows 16A and 16B parallel to the aligned sidewall edge portions of the trench lines. The various subsequent stress inducing processing steps prior in forming M4 may include, for example the deposition of a silicon carbide, silicon nitride, or silicon oxynitride etching stop layer or bottom anti-reflectance coating (BARC) layer which may include thermal cycling at temperatures of greater than about 350° C. It has been found that thermal cycling stresses in subsequent processes carried out at about 350° C. and above in multiple layer devices causes separation of the adhesion/barrier layer at the IMD layer in part due to the CTE mismatches between copper and the IMD material and in part due to poor adhesion between the IMD layer and the adhesion/barrier layer. The present invention of a plasma treatment, preferably including at least one of hydrogen, helium, and argon of an anisotropically etched opening, for example a trench line opening, has been found to prevent the adhesion/barrier layer separation at the IMD layer interface and prevent the initiation and propagation of cracks caused by induced stresses including thermal cycling CTE stresses.

In a first embodiment of the present invention an anisotropically etched opening is provided in a dielectric insulating layer forming a semiconductor wafer process surface. The process surface including the anisotropically etched opening is then optionally subjected to a pre-heating treatment to degas the surface followed by a plasma gas treatment, preferably including at least one of hydrogen, helium, and argon, more preferably a mixture of hydrogen and helium. At least one refractory metal adhesion/barrier layer is then blanket deposited to line the anisotropically etched opening followed by subsequent processes to form a multi-layered device including multiple layered dual damascenes.

In another embodiment the plasma treatment includes a two step treatment where a hydrogen containing plasma treatment, for example a mixture of hydrogen and inert gas such as helium and argon, is followed by an inert gas plasma treatment, for example including at least one of helium and argon. Preferably the hydrogen containing plasma treatment includes a volumetric ratio with respect to the total volume of gas supplied to the plasma of inert gas to hydrogen, for example helium to hydrogen of about 5 to 1 to about 20 to 1.

In another embodiment, preferably the plasma treatment includes a negative DC self-bias voltage to optimize plasma ion bombardment within the anisotropically etched opening.

In a preferred embodiment, the process wafer including the dielectric insulating layer is subjected to a pre-heating treatment of between about 275° C. to about 325° C., more preferably, about 300° C. to degas the process surface prior to the inert gas plasma treatment.

In another embodiment, the plasma treatment is carried out on a trench line in a first metallization layer overlying at least a second metallization layer the second metallization layer including at least one metal filled trench line sidewall edge portion aligned with the trench line sidewall edge portion of the trench line being subjected to the plasma treatment.

Figure 2A:
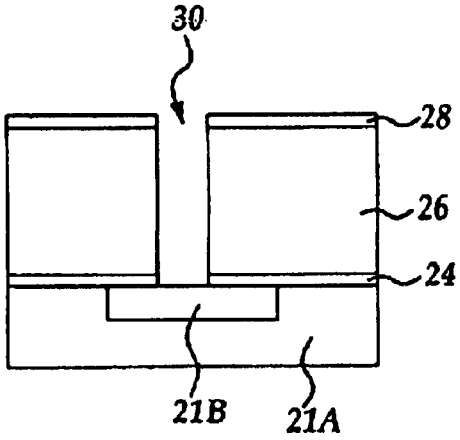
FIGS. 2A–2D are cross-sectional side views of a portion of an exemplary via semiconductor structure at processing stages in one embodiment of the present invention.

The method according to the present invention is more clearly described by referring to FIGS. 2A–2D showing cross sectional side views of a portion of a multi-layered semiconductor wafer at stages in an exemplary manufacturing process to form a dual damascene structure. More specifically, in FIG. 2A is shown an underlying conductive area 21B, for example a copper filled trench line formed in an underlying dielectric insulating layer 21A. For example, conductive area 21B forms part of a metallization layer. Overlying the conductive area 21B is formed an etching stop layer 24, for example, formed of silicon carbide or silicon nitride. The etching stop layer 24 protects the underlying layer and provides selectivity contrast in a subsequent reactive ion etching (RIE) process to form a via opening. The etching stop layer 24 is formed by a conventional chemical vapor deposition (CVD) process including for example, PECVD (plasma enhanced CVD), LPCVD (low pressure CVD), or HDPCVD (high density plasma CVD) having a thickness of about 200 Angstroms to about 1000 Angstroms.

Overlying the etching stop layer 24 is a dielectric insulating layer 26, often referred to as an inter-metal dielectric (IMD) layer. In one embodiment, the dielectric insulating layer is at least one of fluorinated silicate glass (FSG), carbon doped silicon oxide, and organo-silicate glass (OSG). The dielectric layer may be formed by conventional CVD processes, for example PECVD or HDP-CVD, or by spin on processes. Preferably the dielectric insulating layer has a dielectric constant less than about 3.2. In one embodiment, the dielectric insulating layer is formed in a CVD process including organo-silane precursors. For example, the dielectric insulating layer may include commercially available proprietary processes to produce, for example, BLACK DIAMOND®, and SILK® dielectric insulating layers. In another embodiment, the organo-silane precursor includes a cyclo-tetra-siloxane group including a cyclic arrangement of four Si—O groups. In a preferred embodiment, the organo-silane precursor includes at least one of octa-methyl-cyclo-tetra-siloxane and tetra-methyl-cyclo-tetra-siloxane. Preferably, the IMD layer is formed having a thickness of about 3000 to about 10,000 Angstroms.

A bottom anti-reflective coating (BARC) 28, for example silicon oxynitride or silicon oxycarbide, also functioning as an etching stop layer, is preferably deposited to reduce light reflections which can undesirably affect a subsequent photolithographic patterning process. The BARC layer 28 is formed over the IMD layer preferably by a conventional plasma enhanced CVD process, for example, LPCVD, to a thickness of about 200 Angstroms to about 800 Angstroms.

Still referring to FIG. 2A, a conventional photolithographic patterning process is applied to form a via etching pattern and a via opening 30 is formed by a conventional reactive ion etching (RIE) process, for example, using a fluorocarbon and hydrofluorocarbon etching process, typically a multi-step etching process, to form via opening 30 by etching through the underlying layers including the BARC layer 28, IMD layer 26, and etching stop layer 24 to expose the underlying conductive area 21B.

Figure 2B:
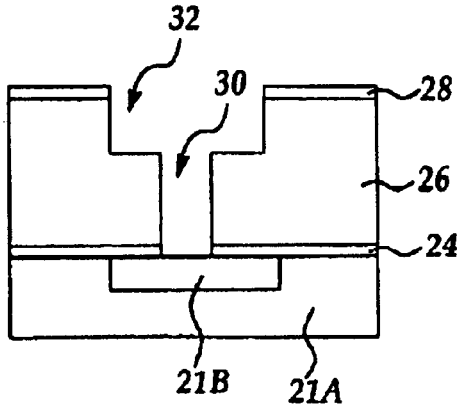

Referring to FIG. 2B, following the formation of via opening 30, a similar series of steps is carried out to photolithographically form a trench line etching pattern overlying and encompassing the via opening 30, followed by a conventional hydrofluorocarbon and fluorocarbon RIE etching process to anisotropically etch trench line opening 32 overlying and encompassing via opening 30. It will be appreciated that the trench line may encompass more than one via opening. In one approach, a resinous material such as an I-line photoresist may optionally be deposited in via opening 30 and etched back to form a via plug (not shown) filling at least a portion of the via opening 30 prior to patterning and anisotropically etching the trench line opening 32. The via plug serves to protect the via sidewalls during the trench line etching process and provides an etching endpoint detection means.

Following processing steps, such as oxygen ashing to remove the photoresist layer and polymeric residue including the via plug, if present, the dual damascene opening is subjected to a plasma treatment according to preferred embodiment of the present invention. The plasma treatment may include any conventional plasma reactor configuration and plasma source including high density, medium density and low density plasmas. For example, for a high density plasma (HDP), the plasma source may include an electron-cyclotron-resonance (ECR) source, a helicon plasma source, an inductively coupled plasma (ICP) source, a dual plasma source (DPS), or a magnetically enhanced RIE (MERIE). For example, in a preferred embodiment the inert gas plasma treatment is carried out in a PECVD reactor including a DPS.

In one embodiment, the plasma treatment includes a hydrogen gas/inert gas mixture, preferably helium, carried out at low pressures. Helium is a preferred gas since it has given superior results under the preferred processing conditions. The precise reason for the superior results is not known although it is believed to be associated with reduced surface damage caused by the helium due to lower momentum transfer under the preferred processing conditions. By the term 'low pressure' is meant including plasmas with a pressure of about 1 milliTorr to about 100 milliTorr. The inert gas plasma treatment in one embodiment preferably includes a pre-heating step to degas the semiconductor wafer where the substrate is heated to about 275° C. to 325° C., more preferably about 300° C. for about 60 seconds to about 180 seconds to degas the wafer process surface. In a first step the plasma treatment is carried out preferably at a pressure of from about 1 milliTorr to about 50 milliTorr, more preferably from about 3 milliTorr to about 20 milliTorr. Individually fed or a premixed mixture of plasma source gas including hydrogen and inert gas is supplied to the plasma having a ratio of inert gas to hydrogen of about 5 to 1 to about 20 to 1 with respect to the total volume of the plasma source gas.

The hydrogen containing plasma is maintained by applying an RF power level of about 200 Watts to about 600 Watts. The RF power level, including an RF amplitude is preferably adjusted to provide a negative DC self-bias voltage of about −150 Volts to about −250 Volts, more preferably about −200 Volts. An RF bias is preferably applied to process wafer through the electrode supporting the process wafer at a power level of about 100 Watts to about 400 Watts to assist in adjusting the negative DC self-bias voltage developed between the plasma and the process wafer. It will be appreciated that the magnitude of the self-bias voltage will depend on the electrode areas and amplitude of the RF signal applied to the power RF electrode and the wafer supporting electrode. The magnitude of the self-bias voltage is essential to achieve the desired effect of the hydrogen plasma treatment. For example, it has been found that the preferred self-bias voltage results in more effective bombardment of the process surface including high aspect ratio openings (e.g., greater than about 4) thereby improving a surface altering effect including increasing a surface hardness. The hydrogen containing plasma treatment is preferably carried out for a period of about 20 seconds to about 200 seconds, most preferably about 60 to about 180 seconds.

Although the precise reason for the beneficial effect of the hydrogen plasma treatment in not known, it is believed that bombarding hydrogen ions increase the surface hardness of the treated siloxane bond containing surface by bonding at coordinatively unsaturated siloxane sites leading to a partial collapse of near surface pores and thereby increasing a near surface density.

Following the hydrogen containing plasma treatment, an optional inert gas plasma treatment, including at least one of helium and argon is carried out. In the optional inert gas treatment plasma operating conditions are preferably altered with respect to the hydrogen containing gas treatment to minimize surface damage. In a preferred embodiment, the plasma is maintained by applying an RF power level of about 25 Watts to about 100 Watts, more preferably about 40 Watts to about 75 Watts. For example, in an exemplary embodiment the inert gas source is supplied at a flow rate of about 400 sccm to about 700 sccm to maintain the plasma. The RF power level, including RF amplitude is preferably adjusted to provide a negative DC self-bias voltage of about −50 Volts to about −150 Volts at the process wafer surface. An RF bias is optionally applied to process wafer through the electrode supporting the process wafer at a power level of about 10 Watts to about 75 Watts to assist in adjusting the negative DC self-bias voltage developed between the plasma and the process wafer. The inert gas plasma treatment is preferably carried out for a period of about 20 seconds to about 180 seconds, more preferably about 60 to about 120 seconds.

Although the precise reason for the beneficial effect of the inert gas plasma treatment, preferably helium, is not known, it is believed that bombarding plasma ions further increase the near surface hardness by partially collapsing near surface pores thereby increasing a near surface density while minimizing surface damage to the trench line sidewalls. In addition, the sputtering effect of the plasma ions cleans the sidewalls of the trench opening from residual contaminants including polymeric residues thereby improving an adhesion of a subsequently deposited adhesion/barrier layer.

Figure 2C:
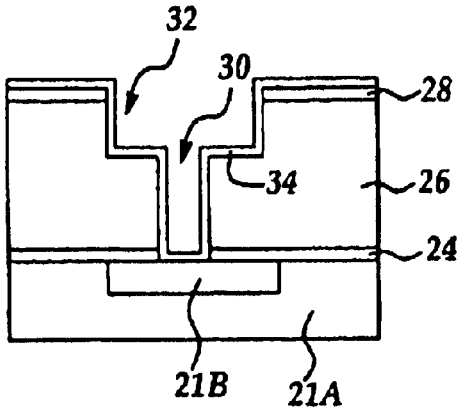

Referring to FIG. 2C, following the plasma treatment including at least one of the hydrogen containing gas plasma treatment and the inert gas plasma treatment, a refractory metal adhesion/barrier layer 34, for example a tantalum nitride layer, is blanket deposited according to a conventional CVD process, for example an LPCVD process. The adhesion/barrier layer 34 is deposited to a thickness of about 50 Angstroms to about 500 Angstroms. In one embodiment, the refractory metal adhesion/barrier layer is deposited in multiple layers, for example from about 2 to about 4 series of LPCVD depositions of about 25 to about 100 Angstroms each. It is believed that the deposition of multiple layers increases the adhesion strength of the adhesion/barrier layer by reducing the formation and buildup of residual stresses compared to a thicker layer deposited in one step. The inert gas plasma treatment including the optional preheating step is optionally carried out following each deposition of one of the refractory metal layers making up the multiple layer adhesion/barrier layer. It will be appreciated that although a tantalum nitride layer is preferred for use with a subsequently electrodeposited copper filling, other barrier/adhesion layers may be used such as tungsten nitride, titanium silicide, and titanium/titanium nitride dual layer or combinations thereof, for example, with the titanium layer deposited first by a PVD process, for example ion metal plasma (IMP), followed by a CVD process to deposit titanium nitride. In addition, a silicided titanium nitride layer may be used, for example, depositing a titanium nitride layer according to a CVD process using TDEAT or TDMAT precursors followed by silicidation with silane gas.

Figure 2D:
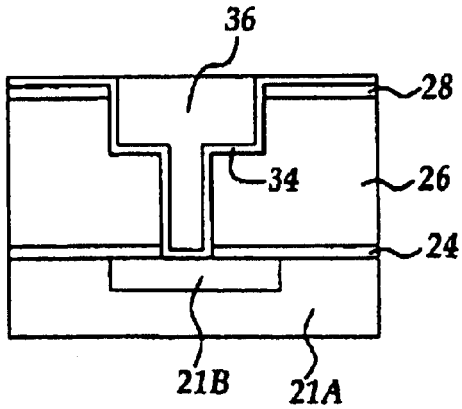

Referring to FIG. 2D, in an exemplary embodiment, a copper seed layer (not shown) is blanket deposited by PVD or CVD methods to provide a continuous electrical pathway for a copper electrodeposition process. A conventional electrodeposition process is then carried out to fill the dual damascene structure with copper or alloy thereof to form copper filling layer 36. A subsequent copper CMP process is then carried out to remove excess copper deposited above the trench line level to complete the formation of the dual damascene structure.

Figure 3:
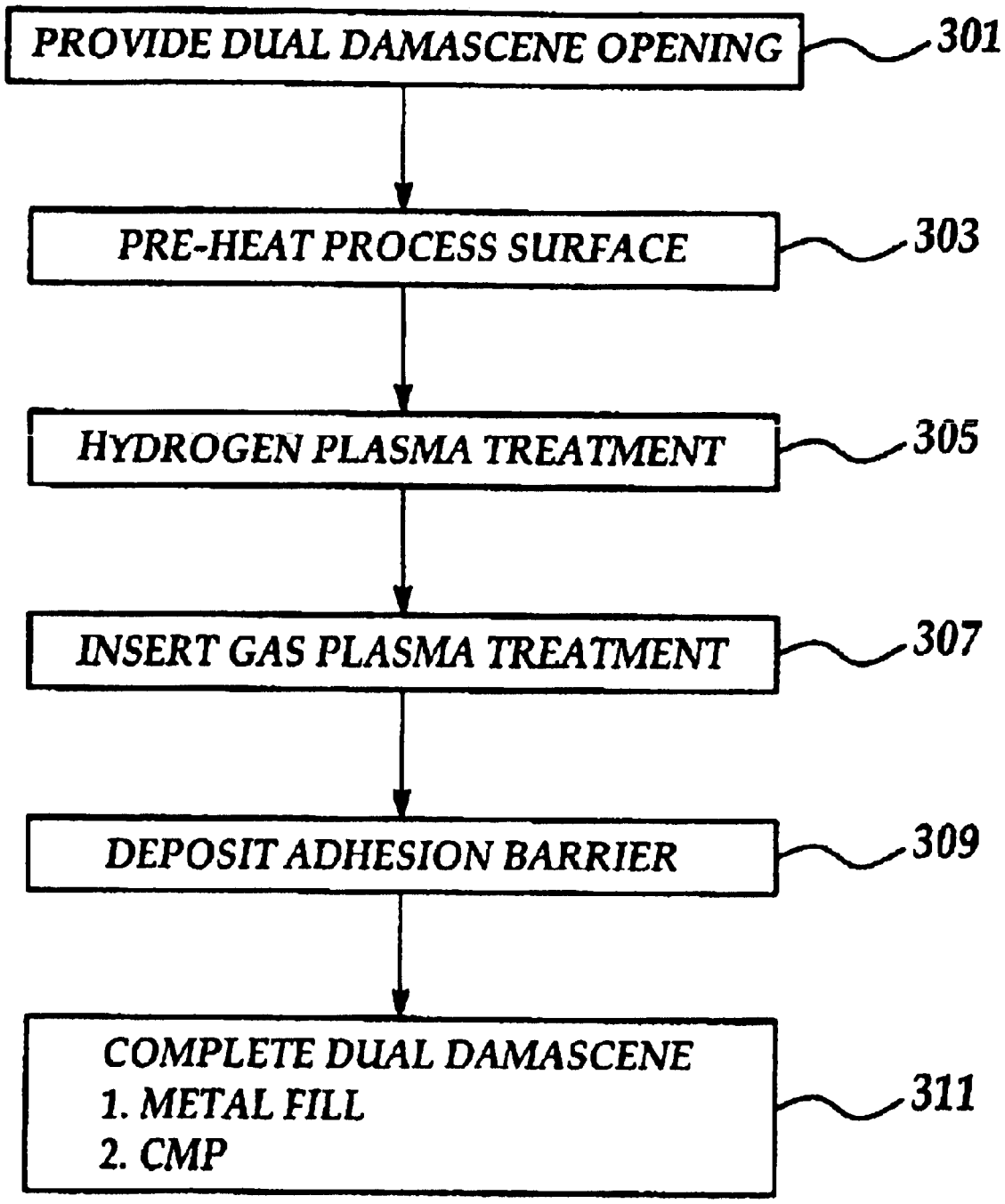
FIG. 3 is a process flow diagram including several embodiments of the present invention.

Referring to FIG. 3 is shown an exemplary process flow diagram including several embodiments of the present invention. In process 301 a semiconductor process wafer is provided having an IMD layer including dual damascene openings. In processes 303 an optional pre-heating degassing process is carried out. In process 305, a hydrogen containing plasma treatment is carried out at relatively high RF power and self bias. In process 307 an optional inert gas plasma treatment is carried out at relatively lower RF power and self bias. In process 309, a refractory metal adhesion/barrier layer is deposited, optionally in multiple steps. In process 311 the dual damascene is completed including, for example metal filling the dual damascene including for example, deposition of a copper seed layer followed by electrodeposition and CMP to planarize the process surface.

Thus, a method has been presented including an inert gas plasma treatment process to improve adhesion of an adjacently deposited refractory metal adhesion/barrier layer thereby resisting adhesion/barrier layer separation and crack initiation in subsequent thermal cycling processes. As such, crack initiation and propagation, for example in trench line sidewall edge portions of a dual damascene structure has been prevented, especially if the process is performed in at least the upper layers, for example greater than about M1 (first metallization layer) or M2 (second metallization layer) of a multiple layer semiconductor device where the cracking problem along substantially aligned edge portions of trench line sidewall edge portions has been found to be most likely to occur.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for plasma treatment of dual damascene openings to improve a crack initiation and propagation resistance of a dielectric insulating layer and improve an adhesion of a barrier/adhesion layer comprising the steps of:

providing a semiconductor process wafer comprising a dielectric insulating layer;

etching according to a reactive ion etch process dual damascene openings comprising the dielectric insulating layer;

removing polymeric residues including photoresist [form] *from* the dual damascene openings;

plasma treating the dual damascene openings in at least a first plasma treatment comprising plasma source gases selected from the group consisting of hydrogen, helium, and argon to densify the surface region of the dual damascene openings; and, blanket depositing at least one refractory metal nitride adhesion/barrier layer to line the dual damascene openings.

2. The method of claim 1, wherein the dielectric insulating layer is selected from the group consisting of PECVD deposited carbon doped silicon oxide and organo-silicate glass (OSG).

3. The method of claim 1, wherein the dielectric insulating layer is formed of organo-silane precursors comprise at least one of octa-methyl-cyclo-tetra-siloxane and tetra-methyl-cyclo-tetra-siloxane groups.

4. The method of claim 1, wherein the at least a first plasma treatment comprises plasma source gases consisting essentially of hydrogen and an inert gas selected from the group consisting of helium and argon.

5. The method of claim 4, wherein the plasma source gases have a volumetric ratio of inert gas to hydrogen of from about 5 to 1 to about 20 to 1.

6. The method of claim 5, wherein the at least a first plasma treatment comprises plasma operating conditions including an RF power between about 200 Watts and about 600 Watts and a bias power provided between about 100 Watts and about 400 Watts to form a negative DC self-bias voltage of about −150 Volts to about −250 Volts.

7. The method of claim 1, wherein the at least a first plasma treatment is carried out at a pressure of about 1 milliTorr to about 100 milliTorr.

8. The method of claim 1, further comprising pre-heating the dual damascene openings to a temperature of about 275° C. to about 325° C. prior to the step of plasma treating.

9. The method of claim 1, further comprising a second plasma treatment comprising a plasma source gas consisting essentially of an inert gas plasma source gas selected from the group consisting of helium and argon.

10. The method of claim 9, wherein the second plasma treatment comprises plasma operating conditions including an RF power between about 25 Watts and about 100 Watts with a bias power provided between about 10 Watts and about 75 Watts to form a negative DC bias voltage between about −50 Volts to about −150 Volts to enhance plasma ion bombardment of the process surface.

11. The method of claim 9, wherein the at least a first plasma treatment and the second plasma treatment are each carried out for a period of about 20 seconds to about 180 seconds.

12. The method of claim 1, wherein the at least one refractory metal nitride adhesion/barrier layer is selected from the group consisting of tungsten nitride, tantalum nitride, titanium/titanium nitride, and silicided titanium nitride.

13. The method of claim 9, wherein the second plasma treatment comprises a plasma source gas consisting essentially of helium.

14. The method of claim 1, further comprising the step of filling the dual damascene openings with a metal selected from the group consisting of aluminum, tungsten, and copper.

15. The method of claim 1, wherein the step of plasma treating is carried out in a PECVD reactor comprising a decoupled plasma sources (DPS).

16. The method of claim 1, wherein the dual damascene openings comprise trench lines formed to have trench line edge portions aligned with trench line edge portions in at least one underlying metallization layer.

17. The method of claim 1, further comprising forming a bottom anti-reflectance coating (BARC) layer over the dielectric insulating layer selected from the group consisting of silicon oxycarbide and silicon oxynitride prior to the step of etching.

18. The method of claim 1, wherein the dual damascene openings comprise a metallization layer higher than at least a first metallization level.

19. A method for plasma treatment of dual damascene openings to improve a crack initiation and propagation resistance of a dielectric insulating layer and improve an adhesion of a barrier/adhesion layer comprising the steps of:

providing a semiconductor process wafer comprising a dielectric insulating layer selected from the group consisting of PECVD deposited carbon doped silicon oxide and organo-silicate glass (OSG);

forming dual damascene openings comprising the dielectric insulating layer;

removing polymeric residues including photoresist from the dual damascene openings;

plasma treating the dual damascene openings in a first plasma treatment process comprising plasma source gases selected from the group consisting of hydrogen, and an inert gas selected from the group consisting of helium and argon;

plasma treating the dual damascene openings in a second plasma treatment process comprising plasma source gases selected from the group consisting helium and argon;

lining the dual damascene openings with a tantalum nitride adhesion/barrier layer; and, backfilling the dual damascene openings with copper.

20. The method of claim 19, wherein the dual damascene openings comprise trench lines formed to have trench line edge portions aligned with trench line edge portions in an underlying metallization layer.

*21. The method of claim 1, wherein dielectric constant of the dielectric insulating layer is less than about 3.2.*

*22. The method of claim 1, wherein the dielectric insulating layer comprises fluorinated silicate glass.*

*23. The method of claim 1, wherein the dielectric insulating layer comprises carbon-doped silicon oxide.*

*24. The method of claim 1, wherein the dielectric insulating layer comprises a low-k material formed by a CVD method.*

*25. The method of claim 1, wherein the dielectric insulating layer comprises an inorganic low-k material.*

*26. The method of claim 1, further comprising forming a BARC layer over the dielectric insulating layer.*

*27. The method of claim 26, wherein a thickness of the BARC layer is between about 200A and about 800A.*

*28. A method for plasma treatment of dual damascene openings to improve a crack initiation and propagation resistance of a dielectric insulating layer and improve an adhesion of a barrier/adhesion layer comprising the steps of:*

*providing a semiconductor process wafer comprising a dielectric insulating layer;*

*etching according to a reactive ion etch process dual damascene openings comprising the dielectric insulating layer;*

*removing polymeric residues including photoresist from the dual damascene openings;*

*plasma treating the dual damascene openings in a hydrogen-containing plasma to densify the surface region of the dual damascene openings; and*

*blanket depositing at least one refractory metal nitride adhesion/barrier layer to line the dual damascene openings.*

*29. The method of claim 28, wherein dielectric constant of the dielectric insulating layer is less than about 3.2.*

*30. The method of claim 28, wherein the dielectric insulating layer comprises fluorinated silicate glass.*

*31. The method of claim 28, wherein the dielectric insulating layer comprises carbon-doped silicon oxide.*

*32. The method of claim 28, wherein the dielectric insulating layer comprises a low-k material formed by a CVD method.*

*33. The method of claim 28, wherein the dielectric insulating layer comprises an inorganic low-k material.*

*34. The method of claim 28, further comprising forming a BARC layer over the dielectric insulating layer.*

*35. The method of claim 34, wherein a thickness of the BARC layer is between about 200A and about 800A.*

*36. A method for plasma treatment of dual damascene openings to improve a crack initiation and propagation resistance of a dielectric insulating layer and improve an adhesion of a barrier/adhesion layer comprising the steps of:*

*providing a semiconductor process wafer comprising a dielectric insulating layer;*

*etching according to a reactive ion etch process dual damascene openings comprising the dielectric insulating layer;*

*removing polymeric residues including photoresist from the dual damascene openings;*

*plasma treating the dual damascene openings in a helium-containing plasma to densify the surface region of the dual damascene openings; and*

*blanket depositing at least one refractory metal nitride adhesion/barrier layer to line the dual damascene openings.*

*37. The method of claim 36, wherein dielectric constant of the dielectric insulating layer is less than about 3.2.*

*38. The method of claim 36, wherein the dielectric insulating layer comprises fluorinated silicate glass.*

*39. The method of claim 36, wherein the dielectric insulating layer comprises carbon-doped silicon oxide.*

*40. The method of claim 36, wherein the dielectric insulating layer comprises a low-k material formed by CVD method.*

*41. The method of claim 36, wherein the dielectric insulating layer comprises an inorganic low-k material.*

*42. The method of claim 36, further comprising forming a BARC layer over the dielectric insulating layer.*

*43. The method of claim 42, wherein a thickness of the BARC layer is between about 200A and about 800A.*

* * * * *